US011706925B2

(12) United States Patent
Hopkins et al.

(10) Patent No.: US 11,706,925 B2
(45) Date of Patent: Jul. 18, 2023

(54) METHODS OF FORMING ELECTRONIC DEVICES WITH CHANNEL OPENINGS OR PILLARS EXTENDING THROUGH A TIER STACK

(71) Applicant: Micron Technology, Inc., Boise, ID (US)

(72) Inventors: John D. Hopkins, Meridian, ID (US); Nancy M. Lomeli, Boise, ID (US); Justin B. Dorhout, Boise, ID (US); Damir Fazil, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/053,134

(22) Filed: Nov. 7, 2022

(65) Prior Publication Data

US 2023/0092501 A1 Mar. 23, 2023

Related U.S. Application Data

(62) Division of application No. 17/032,384, filed on Sep. 25, 2020, now Pat. No. 11,495,617, which is a
(Continued)

(51) Int. Cl.
| | |
|---|---|
| *H10B 43/27* | (2023.01) |
| *H10B 43/35* | (2023.01) |
| *H10B 43/40* | (2023.01) |
| *H10B 41/27* | (2023.01) |
| *H10B 41/35* | (2023.01) |
| *H10B 41/41* | (2023.01) |
| *H01L 21/311* | (2006.01) |
| *H01L 21/02* | (2006.01) |

(52) U.S. Cl.
CPC ............ *H10B 43/27* (2023.02); *H10B 41/27* (2023.02); *H10B 41/35* (2023.02); *H10B 41/41* (2023.02); *H10B 43/35* (2023.02); *H10B 43/40* (2023.02)

(58) Field of Classification Search
CPC ........ H10B 43/27; H10B 43/40; H10B 43/35; H10B 41/35; H10B 41/27; H10B 41/41
See application file for complete search history.

(56) References Cited

U.S. PATENT DOCUMENTS

| | | | |
|---|---|---|---|
| 5,990,509 | A | 11/1999 | Burns et al. |
| 8,278,170 | B2 | 10/2012 | Lee et al. |

(Continued)

FOREIGN PATENT DOCUMENTS

| | | |
|---|---|---|
| CN | 102468280 A | 5/2012 |
| CN | 102201416 A | 11/2015 |
| CN | 108369947 A | 8/2018 |

OTHER PUBLICATIONS

Chinese Office Action and Search Report for Application No. 201910955875.X, dated Jan. 5, 2021, 10 pages.

*Primary Examiner* — Omar F Mojaddedi
(74) *Attorney, Agent, or Firm* — TraskBritt

(57) ABSTRACT

Device, systems, and structures include a stack of vertically-alternating tiers of materials arranged in one or more decks of tiers. A channel opening, in which a channel pillar may be formed, extends through the stack. The pillar includes a "shoulder portion" extending laterally into an "undercut portion" of the channel opening, which undercut portion is defined along at least a lower tier of at least one of the decks of the stack.

20 Claims, 11 Drawing Sheets

Related U.S. Application Data division of application No. 16/157,927, filed on Oct. 11, 2018, now Pat. No. 10,825,828.

(56) References Cited

U.S. PATENT DOCUMENTS

| | | |
|---|---|---|
| 8,546,869 B2 | 10/2013 | Lee et al. |
| 8,680,605 B2 | 3/2014 | Jeon et al. |
| 8,754,466 B2 | 6/2014 | Yun et al. |
| 8,987,089 B1 | 3/2015 | Pachamuthu et al. |
| 9,064,970 B2 | 6/2015 | Simsek-Ege et al. |
| 9,362,302 B1 | 6/2016 | Lai |
| 9,502,471 B1 | 11/2016 | Lu et al. |
| 9,559,201 B2 | 1/2017 | Surthi |
| 9,837,420 B1 | 12/2017 | Ramaswamy |
| 9,941,209 B2 | 4/2018 | Tessariol et al. |
| 10,381,362 B1 | 8/2019 | Cui |
| 10,381,434 B1* | 8/2019 | Pachamuthu .......... H10B 43/50 |
| 2010/0059811 A1* | 3/2010 | Sekine .................. H10B 43/27<br>257/E21.21 |
| 2013/0193395 A1 | 8/2013 | Lee |
| 2014/0264525 A1 | 9/2014 | Takahashi et al. |
| 2015/0079743 A1* | 3/2015 | Pachamuthu .......... H10B 43/27<br>438/268 |
| 2015/0155296 A1* | 6/2015 | Yoon ...................... H10B 43/35<br>257/324 |
| 2016/0133752 A1* | 5/2016 | Hopkins ................ H10B 41/27<br>257/316 |
| 2016/0293623 A1 | 10/2016 | Simsek-Ege et al. |
| 2017/0133392 A1 | 5/2017 | Simsek-Ege et al. |
| 2017/0186765 A1* | 6/2017 | Koval .................... H10B 41/35 |
| 2017/0200801 A1 | 7/2017 | Hopkins et al. |
| 2017/0317098 A1 | 11/2017 | Dorhout et al. |
| 2017/0365481 A1 | 12/2017 | Hopkins |
| 2018/0040626 A1* | 2/2018 | Zhu ....................... H10B 41/27 |
| 2018/0047739 A1 | 2/2018 | Dorhout et al. |
| 2018/0138196 A1 | 5/2018 | Lu et al. |

* cited by examiner

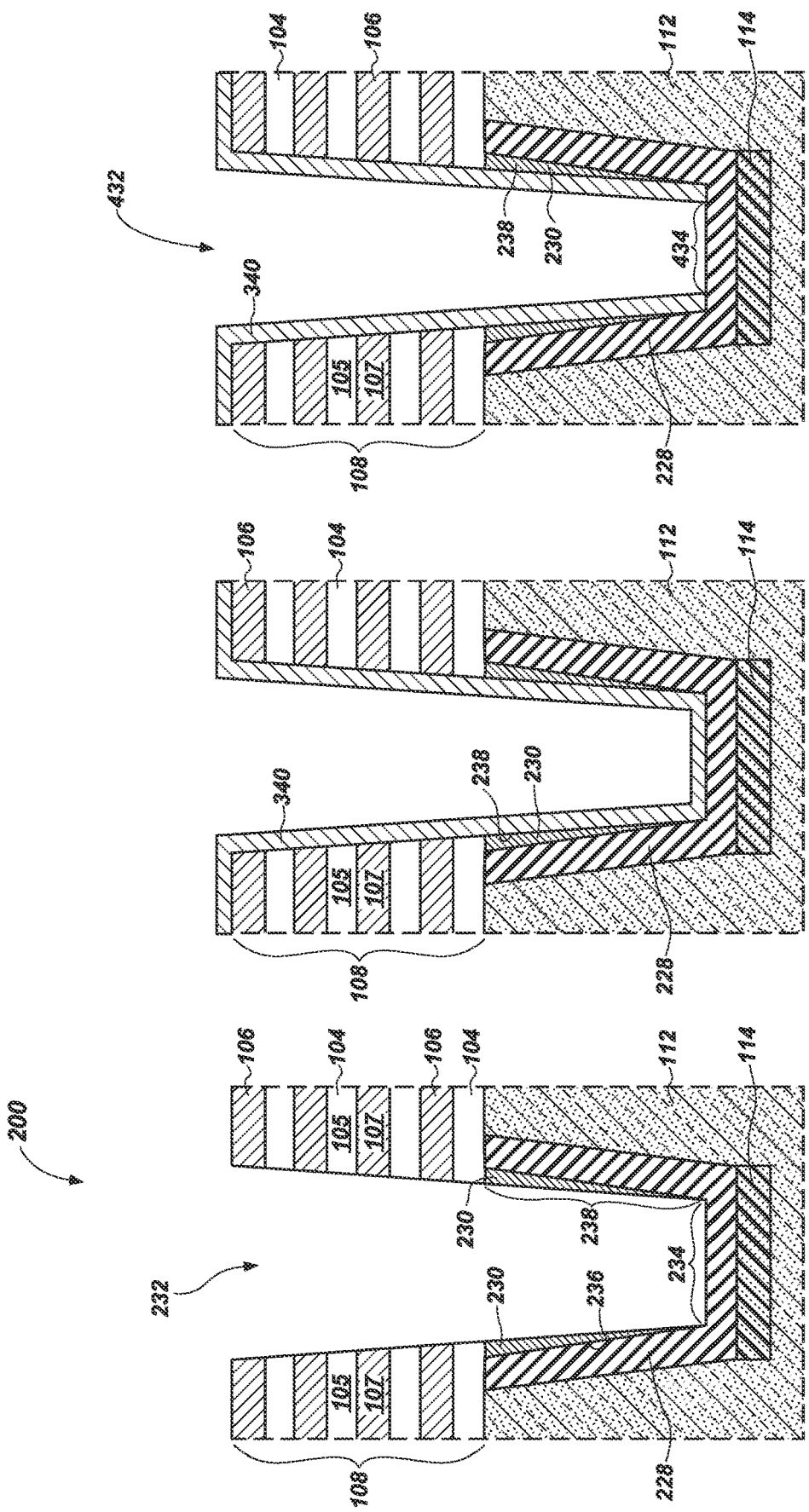

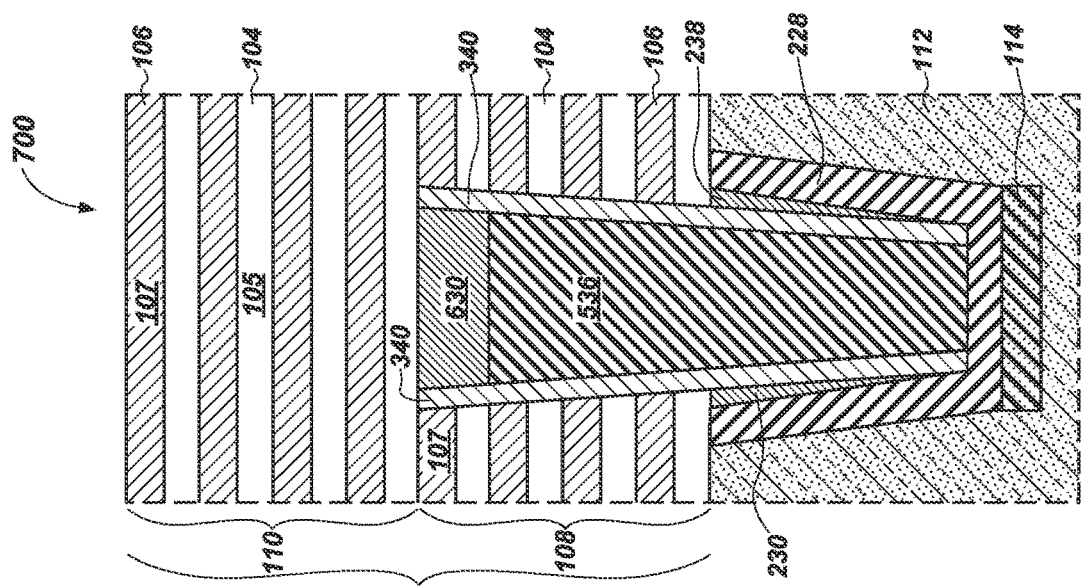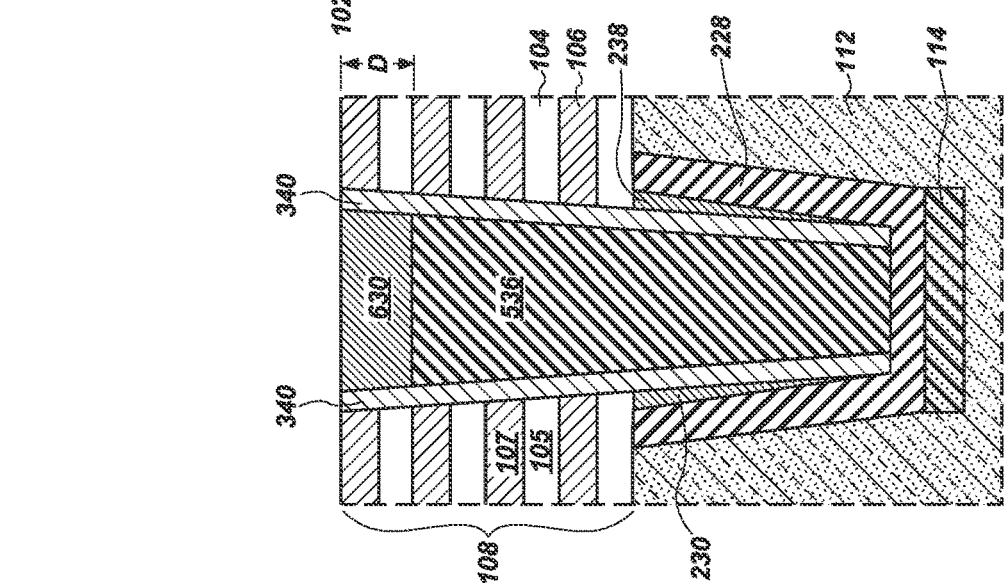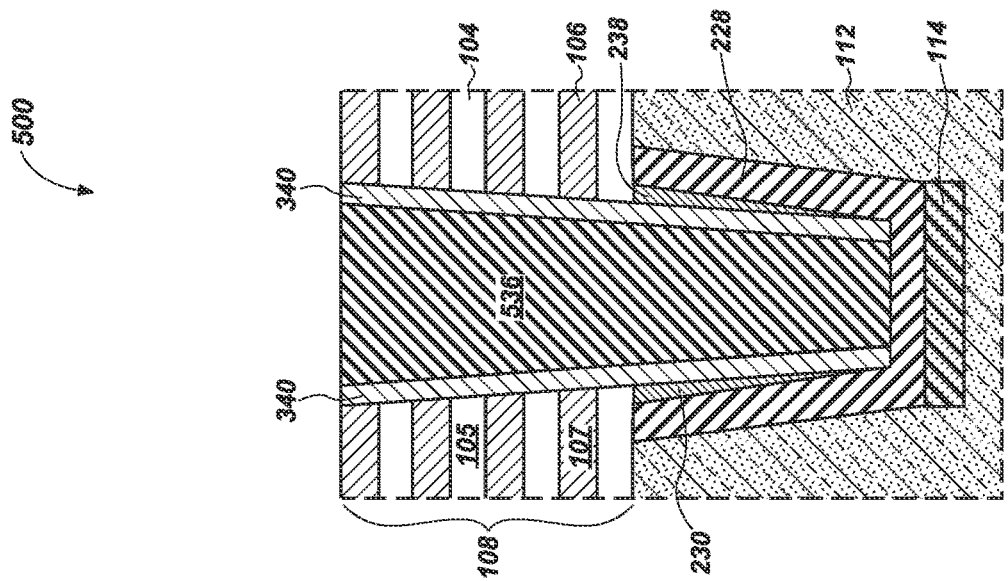

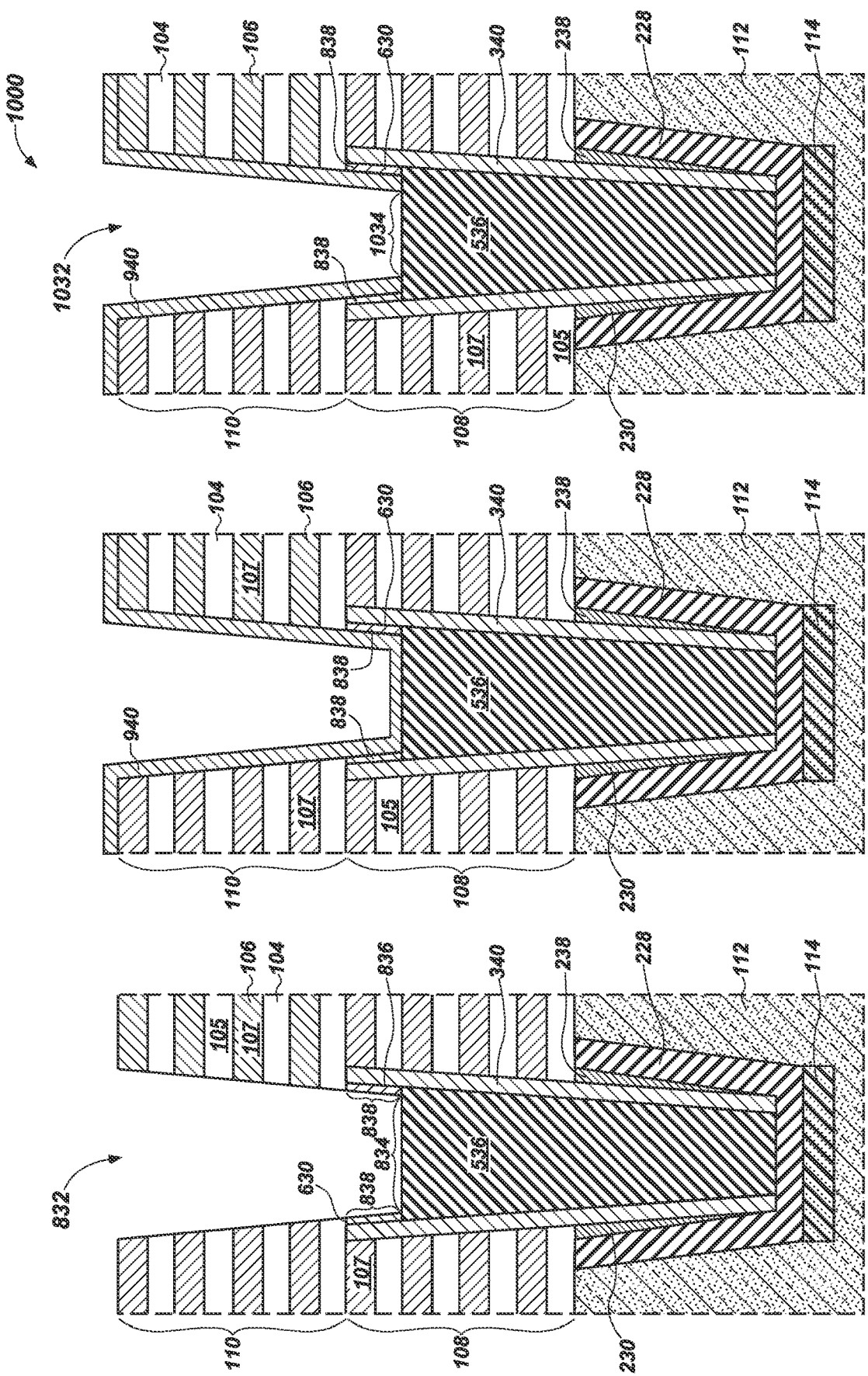

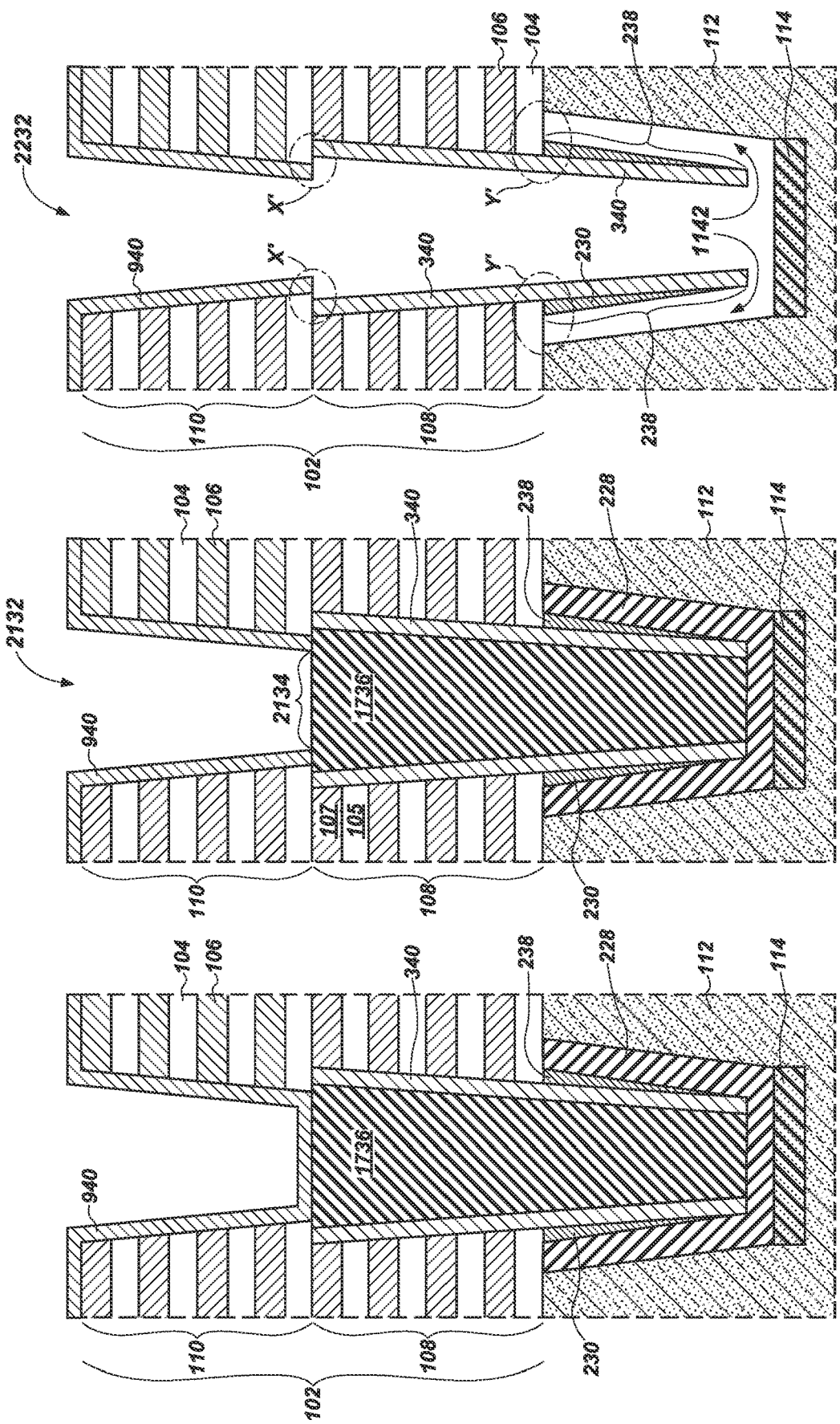

METHODS OF FORMING ELECTRONIC DEVICES WITH CHANNEL OPENINGS OR PILLARS EXTENDING THROUGH A TIER STACK

CROSS-REFERENCE TO RELATED APPLICATIONS

This application is a divisional of U.S. patent application Ser. No. 17/032,384, filed Sep. 25, 2020 (now U.S. Pat. No. 11,495,617, issued Nov. 8, 2022), which is a divisional of U.S. patent application Ser. No. 16/157,927, filed Oct. 11, 2018 (now U.S. Pat. No. 10,825,828, issued Nov. 3, 2020), the disclosure of each of which applications is hereby incorporated in its entirety herein by this reference.

TECHNICAL FIELD

The disclosure, in various embodiments, relates generally to structures with at least one stack of vertically alternating tiers of materials and high aspect ratio openings extending through the at least one stack. More particularly, this disclosure relates to structures for, and methods of forming, semiconductor storage devices having multiple stacked tiers (e.g., three-dimensional (3D) semiconductor memory devices (e.g., 3D NAND memory devices)) and formed with high aspect ratio openings extending into the tiers for a common channel region (e.g., for a single channel).

BACKGROUND

Memory provides data storage for electronic systems. Flash memory is one of various memory types and has numerous uses in modern computers and devices. A typical flash memory device may include a memory array that has a large number of charge storage devices (e.g., memory cells, such as non-volatile memory cells) arranged in rows and columns. In a NAND architecture type of flash memory, storage devices arranged in a column are coupled in series, and the first storage device of the column is coupled to a bit line. In "two-dimensional NAND" (which may also be referred to herein as "2D NAND"), the storage devices are arranged in row and column fashion along a horizontal surface. In "three-dimensional NAND" (which may also be referred to herein as "3D NAND"), a type of vertical memory, not only are the storage devices arranged in row and column fashion in a horizontal array, but tiers of the horizontal arrays are stacked over one another (e.g., as vertical strings of storage devices) to provide a "three-dimensional array" of the storage devices.

To build up the three-dimensional array, multiple tiers of materials are deposited in sequence. The result may be a stack of tiers of insulative material vertically alternating with tiers that include conductive materials. The insulative material vertically alternates with storage devices (e.g., memory cells) in the tiers that include the conductive material.

The storage devices can each include a control gate (CG) and a charge storage structure, such as a floating gate (FG) or charge trap (CT), configured to store electrons or holes accumulated on it. Information is represented by the amount of electrons or holes stored by the cell. The stack may further include a barrier material, such as a nitride in an inter-gate dielectric (IGD) comprising a composite of oxide-nitride-oxide ("ONO"), wherein the IGD may be between the charge storage structure and the CG.

In 3D NAND, access lines, which may also be known as "word lines," may each operably connect storage devices corresponding to a respective conductive-material-including tier of the three-dimensional array. The access lines are coupled to, and in some cases are at least partially formed by, the CGs of the storage devices.

A channel opening extends through a stack of the vertically alternating tiers to an underlying material (e.g., source material), and a single, continuous region of channel material may be formed in each channel opening to contact the underlying material at the bottom of the opening. So, pillars are formed in the channel openings, with each pillar having a single channel region that extends vertically along a three-dimensional array of charge storage devices (e.g., memory cells).

Ideally, channel openings would be formed to define vertical walls (e.g., walls extending at a ninety degree angle relative to an upper surface of the underlying material). In practicality, however, forming channel openings, as by etching, results in sidewalls that taper from a broadest opening width at the uppermost elevations to a narrowest opening width at the deepest elevations. As three-dimensional semiconductor devices, such as those with 3D NAND architecture, are "scaled up" to include a higher density of storage devices per horizontal footprint on a semiconductor chip—e.g., as more and more tiers are built on top of one another it becomes more challenging to form a common channel opening through the tiers with a sufficient exposure of underlying material at the bottom of the opening. Correspondingly, it becomes more challenging to form channel pillars within the deeper openings.

BRIEF DESCRIPTION OF THE DRAWINGS

FIGS. 2 through 16 are cross-sectional, elevational, schematic illustrations during various stages of processing to fabricate the structure of FIG. 1, according to an embodiment of the present disclosure.

FIGS. 17 through 22 are cross-sectional, elevational, schematic illustrations during various stage of processing to fabricate the structure of FIG. 1, according to another embodiment of the present disclosure, wherein FIG. 17 follows the stage illustrated in FIG. 4 and FIG. 22 precedes the stage illustrated in FIG. 13.

DETAILED DESCRIPTION

Figure 1:
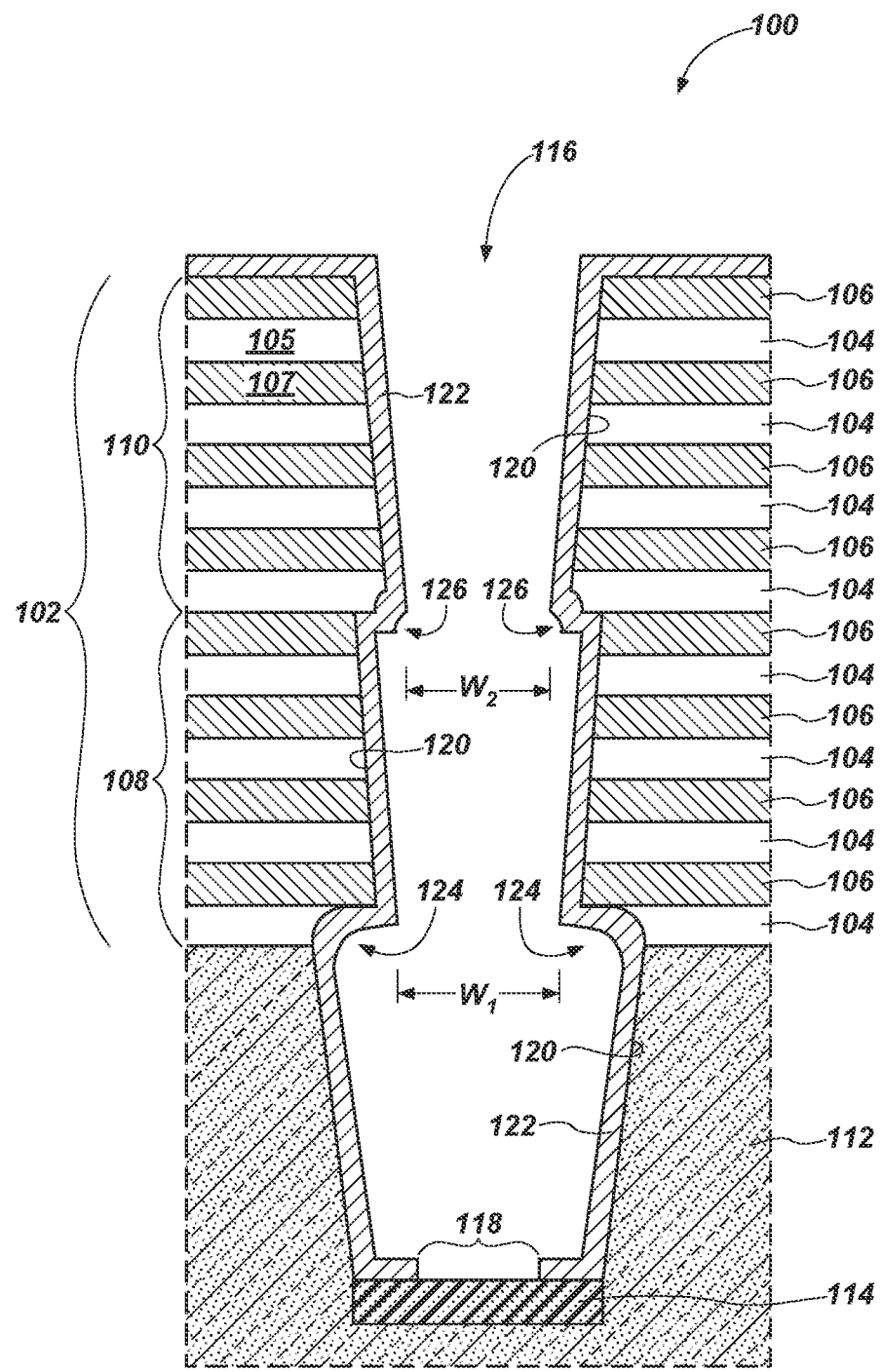
FIG. 1 is a cross-sectional, elevational, schematic illustration of a structure for an array of storage devices with a 3D NAND architecture, according to an embodiment of the present disclosure.

Device, systems, and structures, according to embodiments of the disclosure, include a stack of vertically alternating tiers of materials arranged in one or more decks of tiers. A channel pillar is formed in a channel opening that extends through the one or more decks of the stack to an underlying source material. The pillar includes a "shoulder portion" extending laterally into an "undercut portion" of the channel opening, which undercut portion is defined along at least a lower tier of at least one of the decks of the stack. During fabrication, forming the undercut portion effectively opens up what would otherwise be a narrowed portion (e.g., a "choke point" or "bottle neck") of the channel opening. This enables a greater width to access the lowest areas of the channel opening during fabrication and to expose the underlying source material. It also accommodates formation of the materials of the pillar in the channel opening. So, a greater width at the bottom of the channel opening may be exposed without having to increase the width at the top of the channel opening. In devices, systems, and structures with multiple decks of tiers through which a single channel pillar communicates, each deck may be formed to exhibit the undercut portion along its lower tier so that the resulting single channel pillar defines multiple shoulder portions, each one being adjacent an undercut lower tier of a deck. With each undercut portion broadening what would otherwise be a narrower bottle neck portion, vertical scaling of the three-dimensional structure is enabled.

Structures according to embodiments herein include stacks of vertically alternating tiers of various materials. More particularly, a "stack" includes "insulative tiers" interleaved with "word line tiers." As used herein, the term "insulative tier" means and refers to a tier, in a stack, that comprises insulative material. As used herein, the term "word line tier" means a tier, in the stack, that comprises, at least in a completed structure, conductive material of an access line and which tier is disposed vertically between a pair of insulative tiers, e.g., with one insulative tier below and one insulative tier above.

As used herein, the term "deck" means and includes a plurality of vertically-alternating insulative tiers and word line tiers.

As used herein, the term "stacked decks" means a plurality of decks vertically disposed relative to one another.

As used herein, the term "high aspect ratio" means a height (vertical dimension) to width (horizontal dimension) ratio of greater than 40:1.

As used herein, the term "opening" means a volume extending through another region or material, leaving a gap in that other region or material. Unless otherwise described, an "opening" is not necessarily empty of material. That is, an "opening" is not necessarily void space. An "opening" formed in a region or material may comprise regions or material other than that in which the opening is formed. And, a region or material "exposed" within an opening is not necessarily in contact with an atmosphere or non-solid environment. A region or material "exposed" within an opening may be in contact with or adjacent another region or material that is disposed within the opening.

As used herein, the term "sacrificial material" means and includes a material that is formed during a fabrication process but which is removed prior to completion of the fabrication process.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "horizontal" means and includes a direction that is parallel to a primary surface of the substrate on which the referenced material or structure is located. The width and length of a respective region or material may be defined as dimensions in a horizontal plane.

As used herein, the term "vertical" means and includes a direction that is perpendicular to a primary surface of the substrate on which a referenced material or structure is located. The height of a respective region or material may be defined as a dimension in a vertical plane.

As used herein, the term "thickness" means and includes a dimension in a straight-line direction that is normal to the closest surface of an immediately adjacent material or region of different composition.

As used herein, the term "between" is a spatially relative term used to describe the relative disposition of one material, region, or sub-region relative to at least two other materials, regions, or sub-regions. The term "between" may encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate to" is a spatially relative term used to describe disposition of one material, region, or sub-region near to another material, region, or sub-region. The term "proximate" includes dispositions of indirectly adjacent to, directly adjacent to, and internal to.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "comprises," "comprising," "includes," and/or "including" specify the presence of stated features, regions, stages, operations, elements, materials, components, and/or groups, but do not preclude the presence or addition of one or more other features, regions, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, structure, feature, component, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices, structures, systems, and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

Reference will now be made to the drawings, where like numerals refer to like components throughout. The drawings are not necessarily drawn to scale.

FIG. 1 illustrates an embodiment of a structure 100 for an array of storage devices with a 3D NAND architecture. The structure 100 includes a stack 102 of vertically alternating tiers of materials. The tiers of the stack 102 include insulative tiers 104 interleaved with word line tiers 106.

In some embodiments, the insulative tiers 104 of the stack 102 comprise an insulative material 105 (e.g., an oxide (e.g., silicon oxide)), and the word line tiers 106 comprise different material 107. The different material 107 of the word line tiers 106 may comprise materials for access lines (e.g., word lines (e.g., tungsten (W))), for control gates, for control gate blocking insulators, and for charge storage regions. In some embodiments, the stack 102 may include a stack of oxide and nitride materials, a stack of oxide and polysilicon materials, or a stack of oxide and metal material, with the insulative material 105 comprising the oxide material (e.g., silicon oxide), and the different material 107 of the word line tiers 106 comprising the nitride, polysilicon, or the metal material.

The tiers of the stack 102 are arranged in a plurality of decks. Illustrated are a first deck 108 below and a second deck 110 above. Each of the first deck 108 and the second deck 110 include a plurality of the alternating insulative tiers 104 and word line tiers 106. Though two decks are illustrated, the plurality of decks may include a greater number of decks. In other embodiments, only a single deck may be included.

FIG. 1 illustrates each of the first deck 108 and the second deck 110 as having a total of eight alternating tiers with four insulative tiers 104 and four word line tiers 106 in each of the first deck 108 and the second deck 110. However, each of the decks 108/110 may have more than or fewer than eight tiers 104/106. And, while FIG. 1 illustrates the decks 108/110 as having the same number of tiers 104/106, in other embodiments the first deck 108 may have fewer or more than the number of tiers 104/106 in the second deck 110.

The stack 102 is disposed above a base material 112, which may comprise, consist essentially of, or consist of polysilicon. At least a region of the base material 112 may be doped to provide a source region 114. Dopants used may comprise at least one of phosphorous or arsenic. The source region 114 comprising the dopant may be an isolated region, as illustrated in FIG. 1; or, alternatively, the dopant may be included along a broader area of the base material 112 to extend the source region 114 a greater lateral width (not illustrated in FIG. 1).

A channel opening 116 (e.g., a trench, a hole) extends vertically through the stack 102 and into the base material 112 to expose a portion (e.g., an "exposed portion" 118) of the source region 114. Sidewalls 120 of the channel opening 116 are lined by cell materials 122. The cell materials 122 may comprise a tunnel insulator (e.g., one or more of a nitride (e.g., silicon nitride), an oxide (e.g., silicon oxide), a combination of oxides and nitrides (e.g., oxide-nitride-oxynitride (ONO) materials), or a polysilicon). In subsequent processing, a channel material may be formed within the remaining space of the channel opening 116 in contact with the exposed portion 118 of the source region 114, and extending vertically from the source region 114 and upwards through the stack 102.

The channel opening 116 defines an undercut portion adjacent a lower tier of each of the decks 108/110. For example, an undercut portion 124 of the first deck 108 is adjacent a lower tier of the first deck 108 (e.g., the insulative tier 104 nearest the base material 112); and, an undercut portion 126 of the second deck 110 is adjacent a lower tier of the second deck 110 (e.g., the insulative tier 104 disposed on top of the first deck 108).

The undercut portions 124/126 result from removal of a portion of the material of at least the lower tier of the respective deck 108/110. So, the undercut portions 124/126 effectively carve into an edge of at least the lower tier, and the portion of the sidewall 120 formed by the edge of the lower tier of the respective deck 108/110 is not a taper continuing in alignment with the taper of higher tiers that do not define the undercut portions 124/126. Rather, the slope of the sidewall 120 defined by edges of the tiers 104/106 changes from narrowing the channel opening 116 to increasing the channel opening 116 at an elevation above a lower surface of the lower tier that is undercut.

In some embodiments, the portion of the sidewalls 120 defining the undercut portions 124/126 may be curved. The curve of the undercut portions 124/126 may curve inwardly (from a broader width to a narrower width) along the height of the undercut portions 124/126.

The cell materials 122 may conform to these undercut portions 124/126 such that the cell materials 122 also exhibit the undercut portions. So, the channel opening 116 broadens in width (e.g., becomes increasingly wider at increased depth) along the undercut portions 124/126. Thus, the sidewalls 120 may taper in width with increasing depth along the height of the second deck 110, expand along the undercut portion 126 of the second deck 110, taper in width again with increasing depth along the height of the first deck 108, expand again along the undercut portion 124 of the first deck 108, and then taper in width again with increasing depth along the remaining portion of the channel opening 116 that extends into the base material 112.

Though FIG. 1 illustrates that the undercut portions 124/126 are defined in only the lower tier (e.g., the insulative tier 104) of each of the decks 108/110, in other embodiments, the undercut portions 124/126 may be defined to include at least a portion of the next tiers above, such as the lowest word line tier 106 of each of the decks 108/110.

The inclusion of the undercut portions 124/126 provides a broader opening at the respective elevations in the channel opening 116 to enable easier access for exposing the exposed portion 118 of the source region 114. For example, the undercut portion 124 of the first deck 108 may define opening width $W_1$, and the undercut portion 126 of the second deck 110 may define opening width $W_2$. With these opening widths $W_1/W_2$, the narrowest widths along the channel opening 116 are broader than they would be without the undercut portions 124, 126. So, a broader exposed portion 118 of the source region 114 may be uncovered during fabrication, even if the stack 102 is formed of an extensive number of the tiers 104/106.

Accordingly, disclosed is a semiconductor device comprising a stack of vertically-alternating tiers above a base material. The vertically-alternating tiers comprise vertically-alternating insulative tiers and word line tiers. Sidewalls of the stack define an opening extending through the stack and into the base material, exposing a source region of the base material at the base of the opening. The sidewalls comprise at least one undercut portion defined in at least a lower tier of the stack of vertically-alternating tiers.

With reference to FIGS. 2 through 16, illustrated are various stages in a method of fabricating the structure 100 of FIG. 1. A structure 200, illustrated in FIG. 2, may be fabricated by forming a region of a sacrificial material 228 within the base material 112 above the source region 114. For example, a portion of the base material 112 may be removed (e.g., etched) to define an opening exposing a region of the base material 112 into which dopants may be implanted to form the source region 114. Into the opening, the sacrificial material 228 may be formed.

The sacrificial material 228 may be formulated to act as a stop for a subsequent etching stage. The sacrificial material 228 may comprise, for example, an oxide material (e.g., aluminum oxide), a high-k dielectric material (e.g., magnesium oxide, hafnium oxide, hafnium magnesium oxide), a metal material (e.g., tungsten (W)), or a combination thereof.

A portion of the sacrificial material 228 may then be removed (e.g., etched) to define a recess into which a soft plug material 230 may be formed to fill the opening. The soft plug material 230 is also a sacrificial material with a different composition than the sacrificial material 228 providing the stop so that the sacrificial material 228 may later be removed without removing the soft plug material 230. The soft plug material 230 may comprise an oxide other than an oxide of the sacrificial material 228, in embodiments in which the sacrificial material 228 comprises an oxide.

The insulative material 105 of the insulative tiers 104 and the material 107 of the word line tiers 106 may then be formed (e.g., deposited) in alternating sequence to form the first deck 108 of the stack 102 (FIG. 1). In some embodiments, the material 107 of the word line tiers 106 may comprise, at this stage, a nitride material to be later at least partially removed and replaced with conductive material for forming a word line. In other embodiments, the material 107 of the word line tiers 106 already comprises, at this stage in the fabrication process, conductive material for at least a word line.

The first deck 108 is formed above the base material 112, the soft plug material 230 and the sacrificial material 228. In some embodiments, a lower tier of the first deck 108 may be formed directly on an upper surface of the base material 112, the soft plug material 230, and the sacrificial material 228. In other embodiments, intermediary regions may be formed between.

An opening 232 may then be formed (e.g., by anisotropic etching) to extend through the first deck 108 and through the soft plug material 230, stopping on the sacrificial material 228 such that a portion 234 is exposed at the base of the opening 232. Remaining along sidewalls 236 of the sacrificial material 228 are remnants 238 of the soft plug material 230.

With reference to FIG. 3, a liner 340 is conformally formed to line the opening 232 (FIG. 2). The liner 340 may define a thickness between about 40 Å (about 4 nm) and about 150 Å (about 15 nm) (e.g., about 100 Å (about 10 nm)).

The liner 340 comprises a material formulated such that the sacrificial material 228, the soft plug material 230, and the insulative material 105 may be at least partially removed without removing the liner 340. For example, the liner 340 may comprise, consist essentially of, or consist of polysilicon, metal, germanium (Ge), silicon germanium (SiGe), or a nitride, depending on the compositions of the sacrificial material 228, the soft plug material 230, and the insulative materials 105 to be selectively etched in later stages. For example, in embodiments in which the sacrificial material 228 comprises tungsten (W), the soft plug material 230 comprises an oxide, and the insulative materials 105 comprises an oxide, the liner 340 may comprise, consist essentially of, or consist of polysilicon.

In some embodiments, the liner 340 may be formed directly on the materials of the first deck 108, the soft plug material 230 of the remnants 238, and the portion 234 (FIG. 2) of the sacrificial material 228. In other embodiments, one or more intermediary materials may be between. For example, an oxide liner formed (e.g., grown) by in-situ steam generation (ISSG) may be formed before the liner 340 is formed.

With reference to FIG. 4, a portion of the liner 340 may be removed (e.g., anisotropically etched) (which may be known in the art as "punching through") to expose a portion 434 of the sacrificial material 228 at the base of an opening 432.

The opening 432 may then be filled, to form a structure 500 illustrated in FIG. 5, by forming (e.g., depositing) a fill material 536, which may be another sacrificial material. The fill material 536 comprises a material formulated to provide an etch stop during subsequent processing. It may comprise, consist essentially of, or consist of any of the material described above with regard to the sacrificial material 228. The fill material 536 and the sacrificial material 228 may have the same or different compositions. For example, in some embodiments, the sacrificial material 228 may comprise, consist essentially of, or consist of tungsten (W), and the fill material 536 may comprise an oxide (e.g., aluminum oxide).

With reference to FIG. 6, an upper portion of the fill material 536 may be removed (e.g., etched) to form a recess of depth D, into which another soft plug material 630 may be formed to fill the recess. The other soft plug material 630 may comprise, consist essentially of, or consist of any of the materials described above for the soft plug material 230.

The dimension of depth D may be a height of one to about five of the tiers 104/106 of the first deck 108. For example, the depth D may extend about the height of two tiers (e.g., the height of the uppermost word line tier 106 and the uppermost insulative tier 104), as illustrated in FIG. 6. The dimension of the depth D may be tailored to provide sufficient etchant exposure to a portion of a lower tier of the second deck 110 (FIG. 1), as described further below.

With reference to FIG. 7, the second deck 110 may be formed over the first deck 108 to form structure 700. The second deck 110 covers the soft plug material 630, with a lower tier of the second deck 110 being formed directly on an upper surface of the soft plug material 630, upper surfaces of the liner 340, and an upper surface of an upper tier of the first deck 108. The insulative material 105 of the insulative tiers 104 and the material 107 of the word line tiers 106 may be formed (e.g., deposited in sequence) in the same manner as described above with regard to forming the first deck 108.

With reference to FIG. 8, an opening 832 is formed (e.g., by anisotropic etching) through the tiers 104/106 of the second deck 110 and into the soft plug material 630. The opening 832 may be formed in essentially the same manner as the opening 232 (FIG. 2) was formed, with the fill material 536 functioning as an etch stop material. Remnants 838 of the soft plug material 630 may remain along sidewall portions 836 of the liner 340, with a portion 834 of the fill material 536 exposed.

With reference to FIG. 9, another liner 940 is conformally formed to line the opening 832 (FIG. 8). The liner 940 may comprise any of the materials for liner 340 described above and by any of the processes described above for forming the liner 340. So, the liner 940 may be formed directly adjacent the materials of the second deck 110, the remnants 838 of the soft plug material 630, and the portion 834 (FIG. 8) of the fill material 536. Alternatively, one or more materials (e.g., an oxide material grown by ISSG) may be disposed between the liner 940 and the other materials. In some embodiments, the liner 940 in the opening 832 (FIG. 8) in the second deck 110 may have the same composition as the liner 340 in the opening 232 (FIG. 2) in the first deck 108. In other embodiments, the compositions may differ. Liner 940 may define a thickness between about 40 Å (about 4 nm) and about 150 Å (about 15 nm) (e.g., about 100 Å (about 10 nm)).

In a manner similar to that described above for FIG. 4, a portion of the other liner 940 may be removed (e.g., etched ("punched")), as illustrated in FIG. 10, to expose a portion 1034 of the fill material 536 at the base of an opening 1032. The remnants 838 of the soft plug material 630 may not be exposed in the opening 1032 due to protection by the other liner 940.

Structure 1000, formed by the process stage of FIG. 10, may then be exposed to an etchant selective to the fill material 536 and the sacrificial material 228, relative to the soft plug materials 230, 630 and the material of the liners 340, 940. For example, in embodiments in which the fill material 536 comprises aluminum oxide, the sacrificial material 228 comprises tungsten (W), and the liners 340, 940 comprise polysilicon, the etchant may comprise, for example and without limitation, hydrofluoric acid, hot hydrofluoric acid, an ammonia-peroxide mixture (APM), or a mixture of sulfuric acid ($H_2SO_4$) and hydrogen peroxide ($H_2O_2$) to remove both the fill material 536 and the sacrificial material 228 while leaving the liners 340, 940. In some embodiments, the etchant chemistry may be adjusted during the removal to first remove the fill material 536 and then, after adjustment, to remove the sacrificial material 228.

Figure 11:
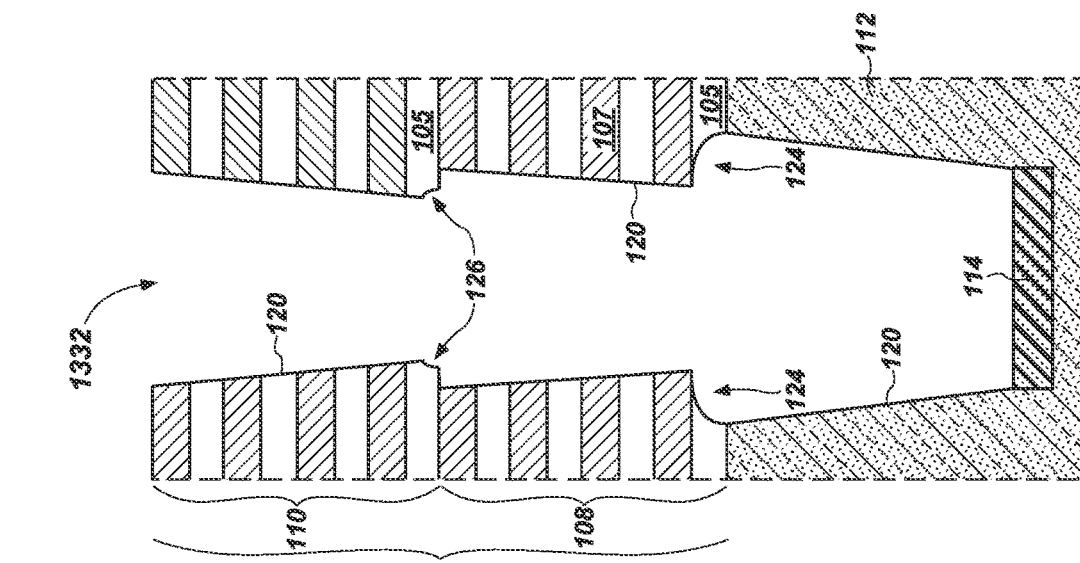

As illustrated in FIG. 11, an opening 1132 is formed in which at least a portion of the soft plug materials 230, 630 are exposed. In the portion of the opening 1132 extending into the base material 112, gaps 1142 between the base material 112 and remnants 238 of the soft plug material 230 remain in the space previously occupied by the sacrificial material 228. In the portion of the opening 1132 extended into the first deck 108, a bottom surface of the remnants 838 of the soft plug material 630 are exposed, and the remnants 838 remain along depth D.

Figure 12:
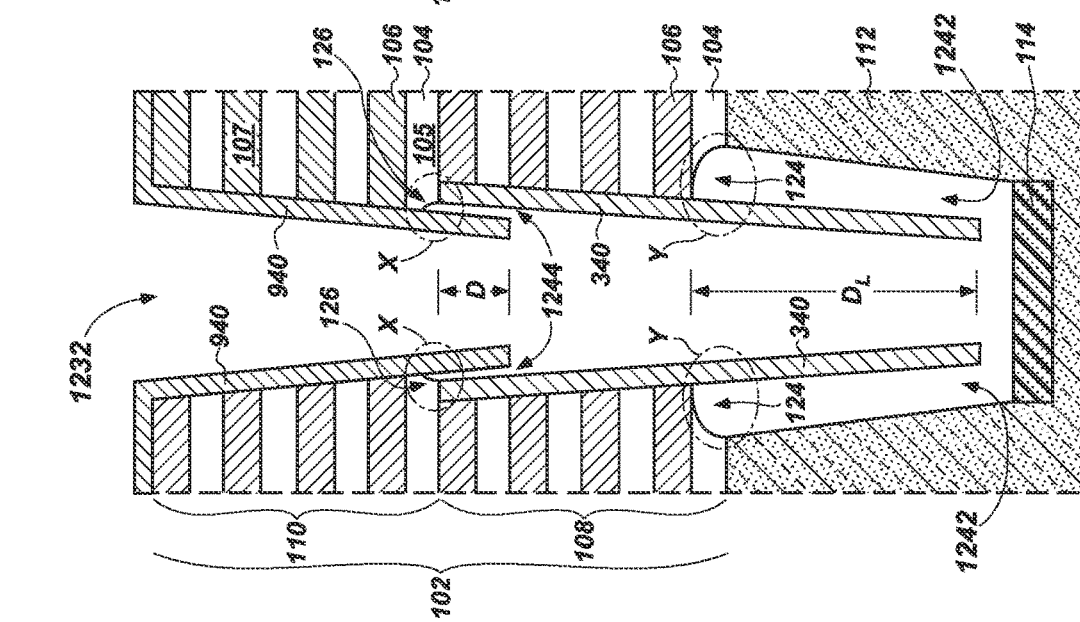

The remnants 238, 838 of the soft plug materials 230, 630 may then be removed before or along with removing portion of the lower tiers (e.g., the lower insulative tiers 104) of the first deck 108 and the second deck 110, in the areas indicated by circles X and Y in FIG. 12. Removing these portions may include exposing structure 1100 (FIG. 11) to an etchant formulated to be selective for the soft plug materials 230, 630 and the insulative material 105 relative to the material of the liners 340, 940. For example, in embodiments in which the liners 340, 940 comprise polysilicon while the soft plug materials 230, 630 and the insulative material 105 comprise oxides, the structure 1100 (FIG. 11) may be exposed to an etchant comprising hydrofluoric (HF) acid.

The etchant removes the remnants 238, 838 of the soft plug materials 230, 630 (FIG. 11), expanding a gap 1242 between the base material 112 and the liner 340 and forming a gap 1244 between liner 340 and liner 940 near the interface between the first and second decks 108, 110. By the gaps 1242, 1244 material of the lower tier of the respective decks 108, 110 is exposed to the etchant, and the etchant is formulated to also etch (e.g., isotropically etch) material of the lower tier in these exposed areas. Thus, the undercut portions 124, 126 are formed in at least the lower tiers, as illustrated in circles X and Y to form opening 1232 illustrated in FIG. 12. Meanwhile, the liners 340, 940 remain in place, providing protection to other tiers 104,106 of the decks 108, 110. So, the lower tier of each deck 108, 110 may be selectively etched, relative to other tiers 104, 106 in the stack 102.

Because an isotropic etchant may be used to form the undercut portions 124, 126, the undercut portions 124, 126 define curved sidewall portions that expand along their depths.

The height of the gaps 1242, 1244 results from previous processing stages. Gap 1242, between the base material 112 and the liner 340 that extends along the first deck 108, has a depth of $D_L$ equal to (or about equal to) a height of the sacrificial material 228 (FIG. 2). So, the depth at which the region of the sacrificial material 228 is formed prior to the stage of FIG. 2 may dictate the depth $D_L$ at which the etchant will wick to etch material of the lower tier of the first deck 108. Likewise, gap 1244, between the liner 940 that extends along the second deck 110 and the liner 340 that extends along the first deck 108, has depth D described above with regard to FIG. 6, defined by the depth D at which the fill material 536 was recessed and filled with the soft plug material 630. So, depths D and $D_L$ may be tailored in light of the etchant's capabilities to act on exposed material at the top of the gaps 1242, 1244. For example, the depths D and $D_L$ may be tailored to enable the etchant to "wick" up into the gaps 1242, 1244 and remove the exposed material (e.g., insulative material 105) of the lower tier of the respective decks 108, 110 to form the undercut portions 124, 126.

Figure 13:
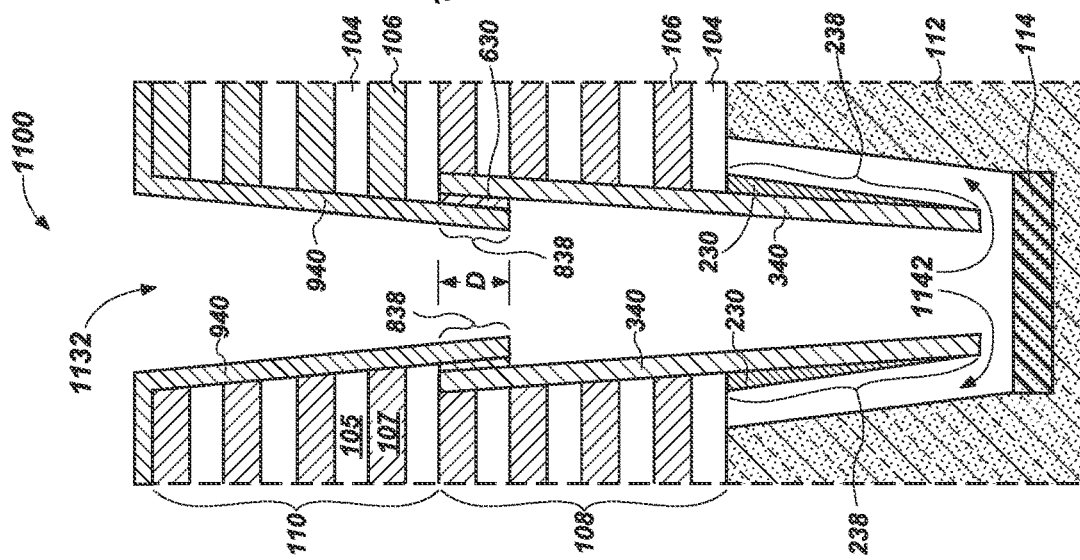

After forming the undercut portions 124, 126, the material of the liners 340, 940 may be removed to form opening 1332 of FIG. 13. For example, in embodiments in which the liners 340, 940 comprise polysilicon, tetramethylammonium hydroxide (TMAH) may be used as an etchant to remove the liners 340, 940. However, any etchant may be used provided it is selective to the material of the liners 340, 940 relative to the insulative material 105 of the insulative tiers 104 and the material 107 of the word line tiers 106 exposed by the removal of the liners 340, 940.

The opening 1332 extends through the whole of the stack 102, to form a channel opening that communicates through the first deck 108, the second deck 110, to the source region 114 at least partially exposed at the base of the opening 1332. The sidewalls 120 defining the opening 1332 are not of a consistent taper throughout the height of the stack 102 nor throughout the height of any one of the decks 108, 110 because the undercut portions 124, 126 expand the width of the opening 1332 adjacent the lower tier from which material was removed.

Though FIGS. 2 through 13 illustrate a process with two decks in the stack 102 (e.g., the first deck 108 and the second deck 110), in other embodiments, the stack 102 may have only one deck (e.g., the first deck 108) or more than two decks. With the fabrication of each deck in addition to the second deck 110, the stages of FIGS. 7 through 10 may be repeated before the formed structure of the plurality of decks is subjected to the stages of FIGS. 11 through 13 (e.g., before the sacrificial materials (e.g., the sacrificial material 228, and the remnants 238, 838 of soft plug materials 230, 630) are removed to define the gaps 1242, 1244 that enable selective etching of the material of the lower tier of each deck). Thus, each of the lower tiers of the respective decks 108, 110 of the stack 102 may be etched in the same stage to form the undercut portions 124, 126 at approximately the same point in the fabrication process.

By the described method embodiments, vertical scaling is enabled even with increasing depth of the channel opening (e.g., the opening 1332 of FIG. 13) because the undercut portions 124, 126 provide wider access to areas at lower depths in the channel opening.

While FIG. 12 illustrates that only the lower tier (e.g., the lowest insulative tier 104) of each of the decks 108, 110 is exposed to and etched to form the undercut portions 124, 126, in other embodiments, the etching may be configured to remove material from more than just the lower tier, e.g., by etching for a longer period of time and/or with different etchant chemistries. Regardless, undercut portions 124, 126 are defined by removing material in the areas X, Y that would otherwise be occupied by material of the tiers 104, 106.

Figure 14:
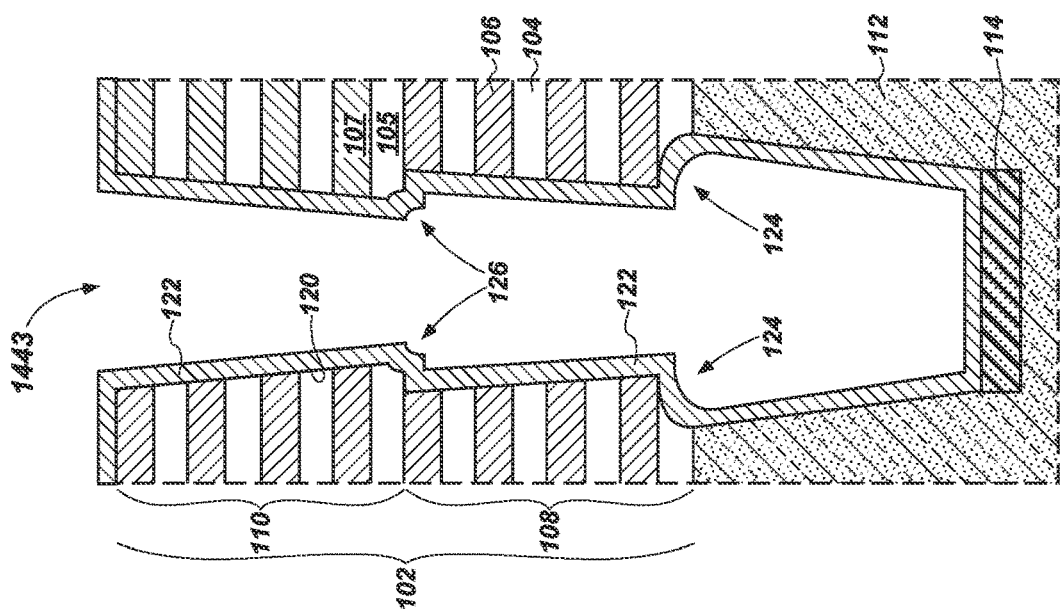

In the opening 1332 that defines the undercut portions 124, 126 may then be formed the cell materials 122 described above with respect to FIG. 1, and as illustrated in FIG. 14, leaving an opening 1443 lined by the cell materials 122. The cell materials 122 may be formed by conformal deposition processes known in the art, and so are not described in detail herein. So, the cell materials 122 may be formed to initially cover the source region 114.

Figure 15:
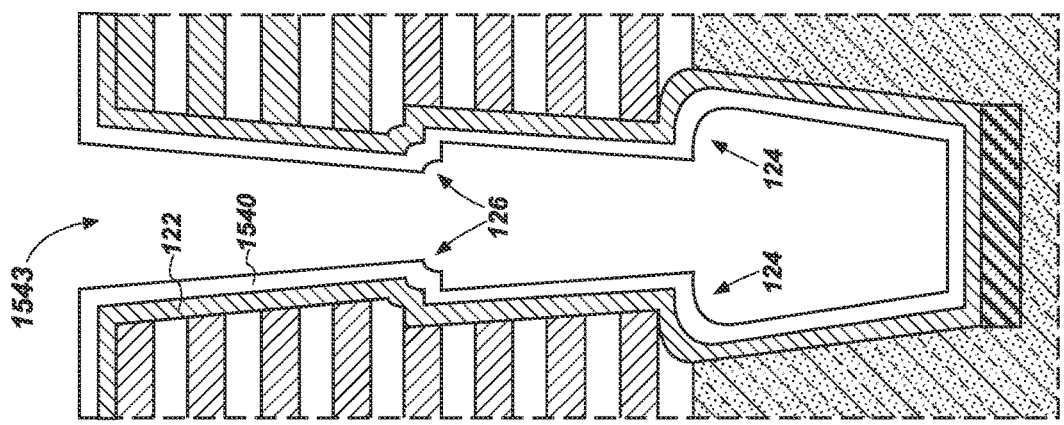

As illustrated in FIG. 15, a liner 1540 may be conformally formed over the cell materials 122, leaving an opening 1543 lined by the liner 1540. The liner 1540 comprises a material formulated to protect the cell materials 122 during subsequent processing. In some embodiments, the liner 1540 may comprise any of the materials described above for liners 340 and 940. The liner 1540 may have the same composition and thickness, or a different composition and/or thickness, as that of either or both of the liners 340, 940.

Figure 16:
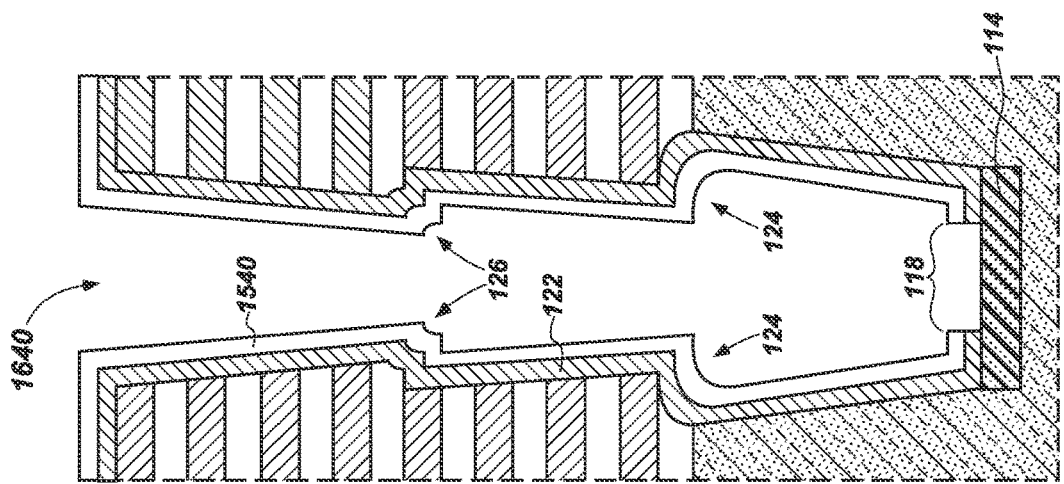

With reference to FIG. 16, a portion of each of the liner 1540 and the cell materials 122 may be removed (e.g., anisotropically etched) to expose portion 118 of the source region 114 in the base of opening 1640. Due to the earlier formation of the undercut portions 124, 126, a greater width of the source region 114 may be exposable for the height of the opening 1640 than could be achieved by conventional channel opening processes that did not include formation of undercut portions 124, 126. The liner 1540 may or may not be removed, subsequently, before completing fabrication of the semiconductor device to include a channel material within the channel opening 1640.

Accordingly, disclosed is a method of forming a semiconductor device. The method comprises forming a stack of vertically-alternating tiers of insulative material and other material over a base material, a sacrificial material disposed in the base material, and a soft plug material disposed in the sacrificial material. An opening is formed extending through the stack and through the soft plug material, leaving remnants of the soft plug material along sidewalls of the opening. A liner is formed in the opening. A portion of the sacrificial material is exposed through the liner. Without removing the liner, the sacrificial material and the remnants of the soft plug material are removed to define a gap between the liner and a sidewall of the base material. The gap exposes a portion of the lower tier of the stack. The portion of the lower tier of the stack is etched to define an undercut portion in the lower tier of the stack. The liner is removed to form a channel opening extending through the stack and into the base material. The channel opening exposes a source region of the base material at a base of the channel opening. The channel opening is defined by sidewalls comprising the undercut portion.

With reference to FIGS. 17 through 22, illustrated is another embodiment of forming the structure 100 of FIG. 1. The stage illustrated in FIG. 17, forming structure 1700, follows the process stage illustrated in FIG. 4 of the above-described method. According to this embodiment, a fill material 1736, formed to fill the opening 432 of FIG. 4, is formulated as an etch stop material. The fill material 1736 is not recessed, and no soft plug material (e.g., soft plug material 630) is formed.

Figure 18:
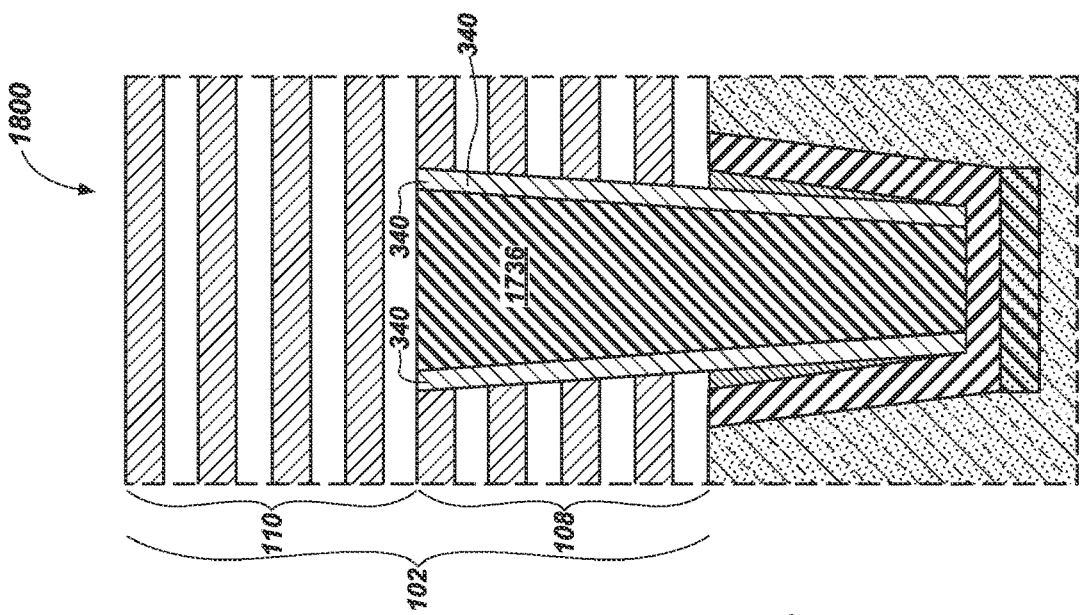
Figure 17:
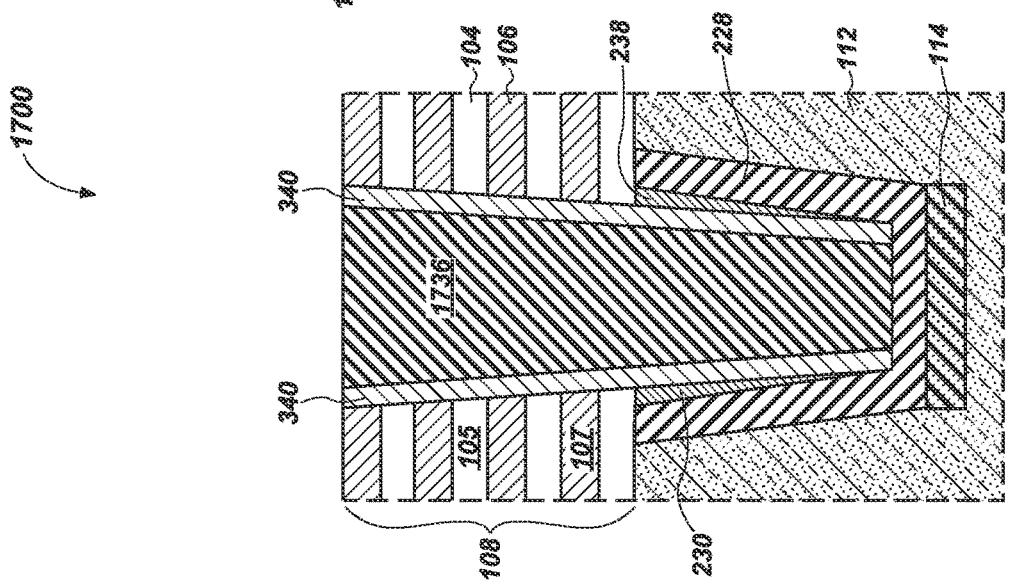

With reference to FIG. 18, the second deck 110 is formed in the same manner as described with respect to FIG. 7, except the lower tier of the second deck 110 is formed over the first deck 108, the liner 340, and the fill material 1736, forming structure 1800.

Figure 19:
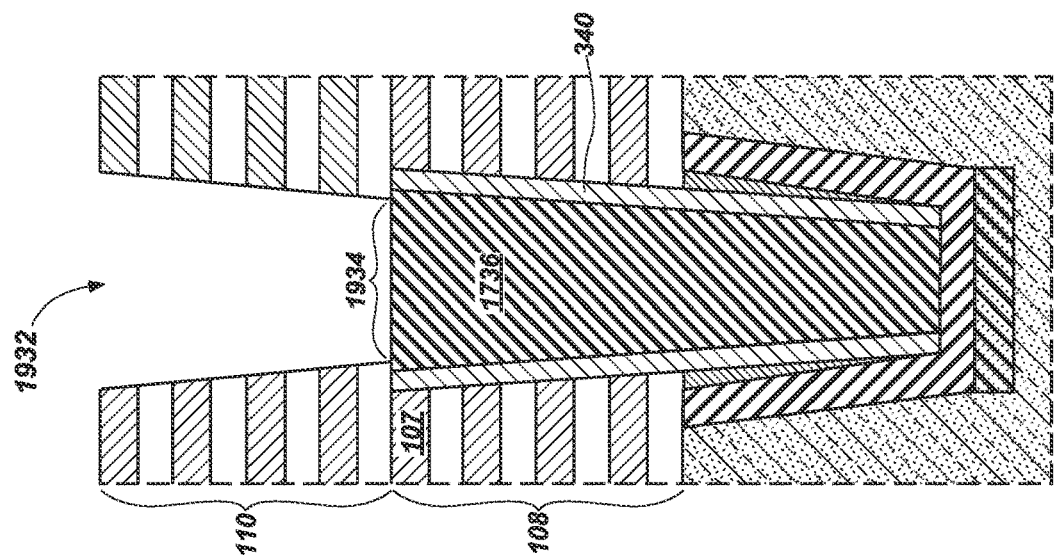

With reference to FIG. 19, the second deck 110 is then etched down to the upper surface of the fill material 1736 to expose a portion 1934 of the fill material 1736 at the base of an opening 1932. The etching process may be the same process described above with respect to FIG. 8.

With reference to FIG. 20, the liner 940 may then be formed in the same manner as described above with regard to FIG. 9, except that the liner 940 wholly covers sidewalls of the tiers 104, 106 of the second deck 110 and does not extend into elevations of the first deck 108.

With reference to FIG. 21, the liner 940 may be partially removed to expose portion 2134 of the fill material 1736 at a base of opening 2132, in the same manner as described above with regard to FIG. 10, expect that the portion 2134 of the fill material 1736 exposed is coplanar with a lower surface of the lower tier of the second deck 110.

The fill material 1736 and the sacrificial material 228 may then be removed (e.g., exhumed) in a manner similar to the removal of the fill material 536 and the sacrificial material 228 in the stage of FIG. 11, described above. The remnants 238 of the soft plug material 230 may then be removed in the same manner described above with regard to FIG. 11. This exposes at least portions (in circles X' and Y' of FIG. 22) of the material of the lower tier of each of the decks 108, 110 (e.g., insulative material 105 of the lower tier), which material can then be isotropically etched in the same manner as in FIG. 12 to define the undercut portions 124, 126 of FIG. 1.

However, according to the embodiment of FIGS. 17 through 22, the lower tier of the second deck 110 is exposed directly into opening 2232 without an intervening gap (e.g., the gap 1244 of FIG. 12). Nonetheless, at least a portion of the lower tier is etched to define the undercut portion 126 of FIG. 13. FIG. 13 follows the stage of FIG. 22, and the process may continue as previously described to form the structure 100 of FIG. 1. Though the undercut portion 126 formed by the embodiment including FIGS. 17 through 22 may have a different size or shape than the undercut portion 126 formed by the embodiment including FIGS. 2 through 16, the undercut portion 126 nonetheless broadens what would otherwise be a narrower bottleneck point of the opening 1332 (FIG. 13) and final opening 1640 (FIG. 16) and subsequently formed channel pillar.

As with the above-described embodiment, the stages of FIGS. 17 through 21 could be repeated an indefinite number of times to form additional decks of tiers 104, 106 to vertically scale up the structure before the fill material 1736 of each deck and the sacrificial material 228 in the base material 112 is removed to expose portions of the lower tier of each deck.

In some embodiments, the fill material 1736 may also have been used to form the region in the base material 112 below the first deck 108, e.g., the region occupied by the sacrificial material 228 and the soft plug material 230 according to the above-described embodiments. In such alternative embodiment, opening 232 of FIG. 2 would have a lower surface coplanar with a lower surface of the first deck 108 and exposing a portion of a fill material such as the fill material 1736 if used in place of the sacrificial material 228 and the soft plug material 230. A liner through the first deck 108 (such as the liner 340) would extend to a lower elevation coplanar with the lower surface of the first deck 108, and later removal of the fill material 1736 would therefore expose a portion of the lower tier of the first deck 108 in a manner similar to that of the second deck 110 described in regard to FIG. 22. Nonetheless, the subsequent isotropic etching would selectively etch into the lower tier of each deck 108, 110 while other tiers of the deck 108, 110 are protected by the liners 340, 940. And, the undercut portions 124, 126 would be formed and enable wider access to expose the source region 114 at the bottom of the channel opening.

In other embodiments, the processes forming the soft plug material 230, 630 remnants 238, 838 and subsequent gaps 1242, 1244 to expose portions of lower tier material may be used with some tiers of the stack 102, while the processes of FIGS. 17 through 22 may be used with some other tiers of the stack 102.

Accordingly, disclosed is a method of forming a semiconductor device. The method comprises forming a first deck of vertically-alternating tiers of insulative material and other material over a base material and a sacrificial material disposed in the base material. An opening is formed to extend through the first deck and into the sacrificial material. A liner and a fill material are formed within the opening. A second deck of vertically-alternating tiers of the insulative material and the other material is formed over the first deck, the liner, and the fill material. Another opening is formed to extend through the second deck to the fill material within the other opening. Another liner is formed within the other opening, and a portion of the fill material is exposed through the other liner. Without removing the liner or the other liner, the fill material and the sacrificial material are removed to form an extended opening exposing at least a portion of a lower tier of each of the first deck and the second deck. The portion of the lower tier of each of the first deck and the second deck is isotropically etched to define undercut portions. The liner and the other liner are removed to form a channel opening defined by sidewalls comprising the undercut portions.

Figure 23:
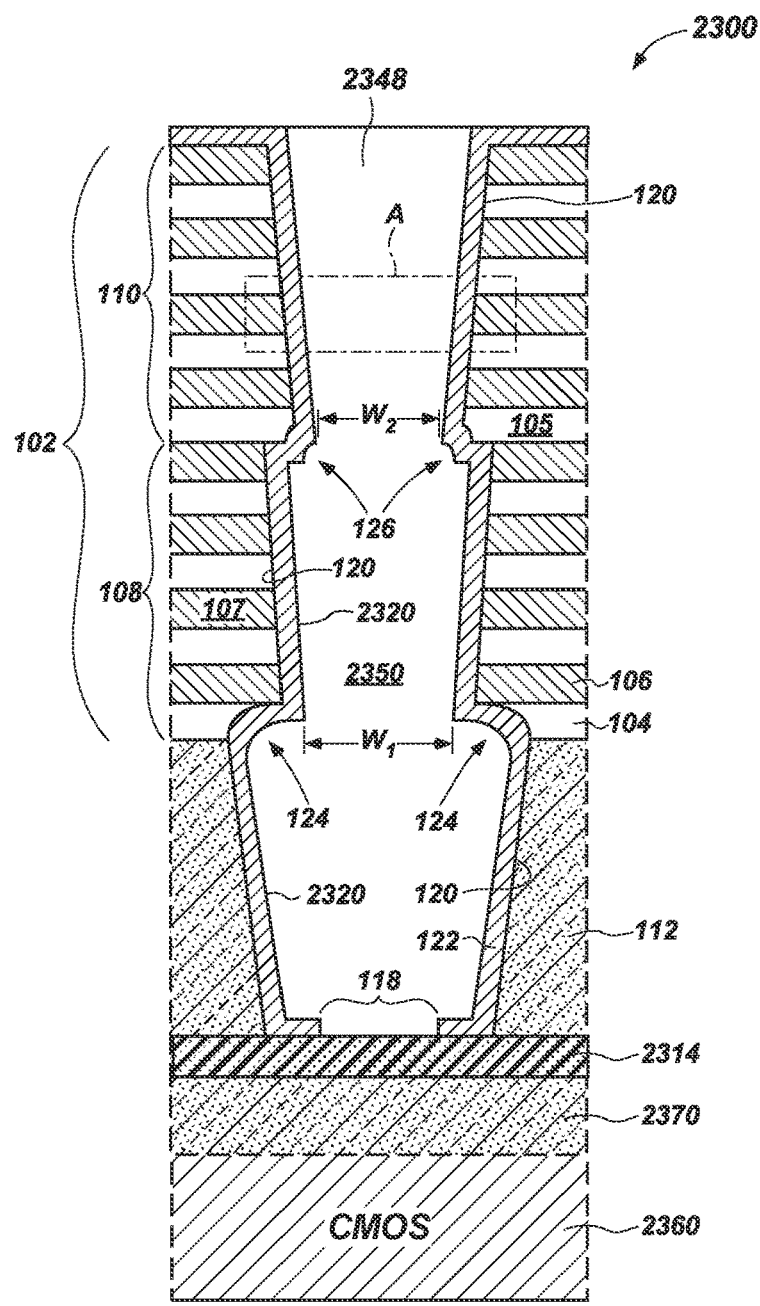
FIG. 23 is a cross-sectional, elevational, schematic illustration of a structure for an array of storage devices with a 3D NAND architecture that includes CMOS under Array (CuA) components, according to an embodiment of the present disclosure.

With reference to FIG. 23, illustrated is a structure 2300 of a semiconductor device in which a channel pillar 2348 has been formed by forming a channel material 2350 within what was the space of channel opening 116 (FIG. 1). The channel material 2350 of the channel pillar 2348 extends through all decks of the stack 102 (e.g., through the first deck 108 and the second deck 110), into the base material 112 to contact the exposed portion 118 that was at the bottom of the channel opening 116 (FIG. 1).

Because the dopant providing the source region 114 (FIG. 1) of the structure 100 (FIG. 1) may, alternatively, be included along more area of the base material 112, a source region 2314 such as illustrated in FIG. 23 may be included, with the source region 2314 extending horizontally a greater distance than the discrete region of the source region 114 in the base material 112 of FIG. 1.

The channel pillar 2348 defines shoulders along the undercut portions 124, 126. The shoulders are formed by filling the undercut portions 124, 126 with the channel material 2350. So, the channel pillar 2348, according to embodiments of the disclosure, has sidewalls 2320 along the cell material 122, and the sidewalls 2320 taper inward through the second deck 110, expand outward through undercut portion 126, taper inward again through the first deck 108, expand outward again through undercut portion 124, and then taper inward again toward the source region 2314. Because the undercut portions 124, 126 may be formed by isotropic etching, the corresponding shoulder portions of the channel pillar 2348 may defined curved portions of the sidewalls 2320.

In some embodiments, the structure 2300 that includes the channel pillar 2348 may further include CMOS (complementary metal-oxide-semiconductor) circuitry 2360 below the channel pillar 2348 (e.g., below the source region 2314). Such structure 2300 may be characterized as having "CMOS under Array" ("CuA") components. The region comprising the CMOS circuitry 2360 may be spaced from the source region 2314 by one or more intervening materials, such as an additional region 2370 of the base material 112.

In embodiments with CMOS under Array components, the base material 112 may comprise polycrystalline silicon. In embodiments without CMOS under Array components, the base material 112 may comprise polycrystalline silicon or monocrystalline silicon.

Figure 24:
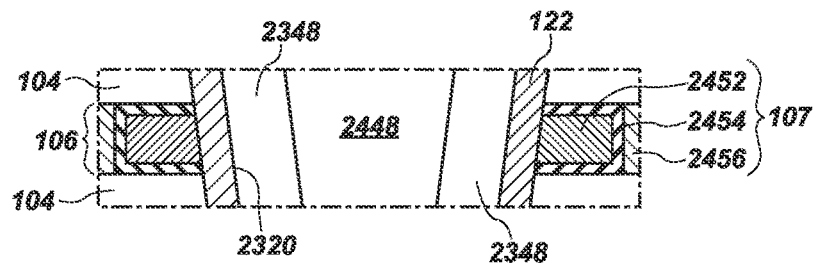
FIG. 24 is an enlarged illustration of box A from FIG. 23, according to another embodiment of the present disclosure.

With reference to FIG. 24, illustrated is an enlarged view of box A of FIG. 23, according to an alternative embodiment. In embodiments such as this, the channel material 2350 may not completely fill a width of the channel pillar 2348 (FIG. 23), but may be formed to line the sidewalls 2320 of the channel pillar 2348. Another material or void space (collectively, 2448), may fill a central portion of the channel pillar 2348.

FIG. 24 also illustrates example material 107 of the word line tiers 106. Such material 107 may include conductive material 2452 (e.g., of gates (e.g., control gates, floating gates), charge traps, and/or storage devices) in addition to access lines (word lines); insulative material 2454 (e.g., of inter-gate dielectric regions), as well as other material 2456. In some embodiments, the conductive material 2452 may be present in the word line tiers 106 prior to the stage of, e.g., FIG. 2. In other embodiments, the conductive material 2452 may be formed by replacing selective portions of the material 107 of the word line tiers 106 after forming the undercut portions 124, 126, such as after the stage of FIG. 13 but before forming the cell materials 122.

Accordingly, disclosed is a semiconductor device comprising a stack of vertically-alternating tiers above a base material and above CMOS circuitry components. The vertically-alternating tiers comprise tiers comprising insulative material vertically interleaved with tiers comprising word lines. A channel pillar extends through the stack and into the base material to a source region at a base of the channel pillar. A sidewall of the channel pillar defines a shoulder portion laterally adjacent at least a lower tier of the stack of vertically-alternating tiers.

Figure 25:
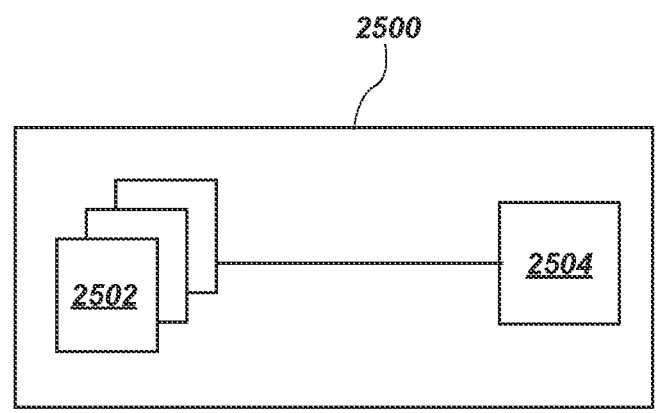
FIG. 25 is a simplified block diagram of a semiconductor device including arrays of storage devices having structures according to one or more embodiments of the present disclosure.

With reference to FIG. 25, illustrated is a simplified block diagram of a semiconductor device 2500 implemented according to one or more embodiments described herein. The semiconductor device 2500 includes a memory array 2502 having 3D NAND architecture and a control logic component 2504. The memory array 2502 may include a plurality of the structures 100 (FIG. 1), 2300 (FIG. 23) including any of the stack of vertically-alternating tiers defining undercut portions 124, 126 along at least lower tiers of each deck of the stack discussed above, which may have been formed according to a method described above. The control logic component 2504 may be configured to operatively interact with the memory array 2502 so as to read from or write to any or all memory cells (e.g., the devices with structure 100 (FIG. 1) or 2300 (FIG. 23)) within the memory array 2502.

Figure 26:
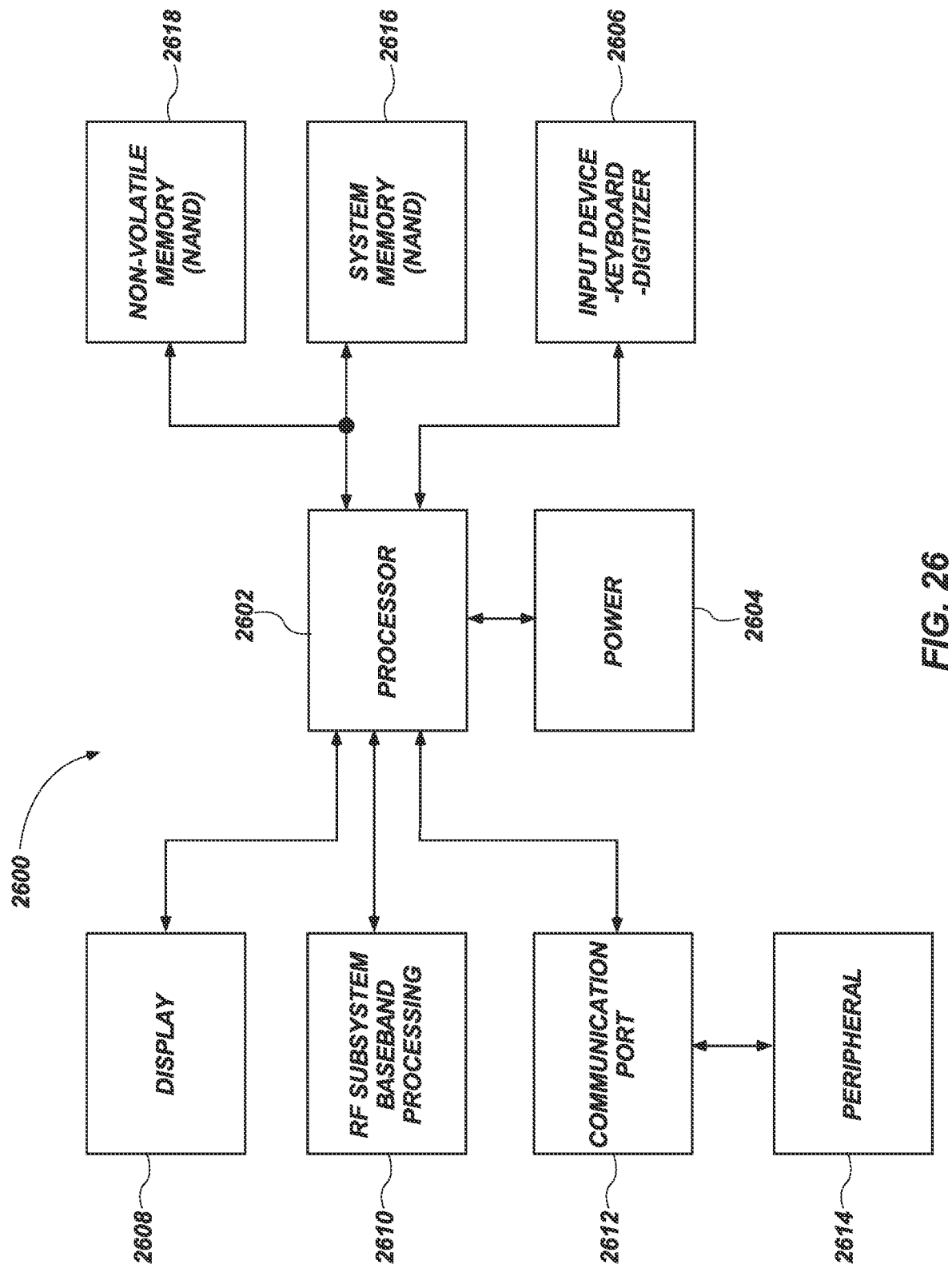
FIG. 26 is a simplified block diagram of a system implemented according to one or more embodiments of the present disclosure.

With reference to FIG. 26, depicted is a processor-based system 2600. The processor-based system 2600 may include various electronic devices manufactured in accordance with embodiments of the disclosure. The processor-based system 2600 may be any of a variety of types such as a computer, pager, cellular phone, personal organizer, control circuit, or other electronic device. The processor-based system 2600 may include one or more processors 2602, such as a microprocessor, to control the processing of system functions and requests in the processor-based system 2600. The processor 2602 and other subcomponents of the processor-based system 2600 may include semiconductor devices (e.g., 3D NAND memory devices) manufactured in accordance with embodiments of the disclosure.

The processor-based system 2600 may include a power supply 2604 in operable communication with the processor 2602. For example, if the processor-based system 2600 is a portable system, the power supply 2604 may include one or more of a fuel cell, a power scavenging device, permanent batteries, replaceable batteries, and rechargeable batteries. The power supply 2604 may also include an AC adapter; therefore, the processor-based system 2600 may be plugged into a wall outlet, for example. The power supply 2604 may also include a DC adapter such that the processor-based system 2600 may be plugged into a vehicle cigarette lighter or a vehicle power port, for example.

Various other devices may be coupled to the processor 2602 depending on the functions that the processor-based system 2600 performs. For example, a user interface 2606 may be coupled to the processor 2602. The user interface 2606 may include input devices such as buttons, switches, a keyboard, a light pen, a mouse, a digitizer and stylus, a touch screen, a voice recognition system, a microphone, or a combination thereof. A display 2608 may also be coupled to the processor 2602. The display 2608 may include an LCD display, an SED display, a CRT display, a DLP display, a plasma display, an OLED display, an LED display, a three-dimensional projection, an audio display, or a combination thereof. Furthermore, an RF sub-system/baseband processor 2610 may also be coupled to the processor 2602. The RF sub-system/baseband processor 2610 may include an antenna that is coupled to an RF receiver and to an RF transmitter (not shown). A communication port 2612, or more than one communication port 2612, may also be coupled to the processor 2602. The communication port 2612 may be adapted to be coupled to one or more peripheral devices 2614, such as a modem, a printer, a computer, a scanner, or a camera, or to a network, such as a local area network, remote area network, intranet, or the Internet, for example.

The processor 2602 may control the processor-based system 2600 by implementing software programs stored in the memory. The software programs may include an operating system, database software, drafting software, word processing software, media editing software, or media playing software, for example. The memory is operably coupled to the processor 2602 to store and facilitate execution of various programs. For example, the processor 2602 may be coupled to system memory 2616, which may include memory with 3D NAND architecture, dynamic random access memory (DRAM), static random access memory (SRAM), racetrack memory, and other known memory types. The system memory 2616 may include volatile memory, non-volatile memory, or a combination thereof. The system memory 2616 is typically large so that it can store dynamically loaded applications and data. In some embodiments, the system memory 2616 may include semiconductor devices, such as the semiconductor device 2500 of FIG. 25, semiconductor devices including any of the structures 100 (FIG. 1), 2300 (FIG. 23) described above, or a combination thereof.

The processor 2602 may also be coupled to non-volatile memory 2618, which is not to suggest that system memory 2616 is necessarily volatile. The non-volatile memory 2618 may include one or more of NAND (e.g., 3D NAND) memory, read-only memory (ROM) such as an EPROM, resistive read-only memory (RROM), and other flash memory to be used in conjunction with the system memory 2616. The size of the non-volatile memory 2618 is typically selected to be just large enough to store any necessary operating system, application programs, and fixed data. Additionally, the non-volatile memory 2618 may include a high capacity memory such as disk drive memory, such as a hybrid-drive including resistive memory or other types of non-volatile solid-state memory, for example. The non-volatile memory 2618 may include semiconductor devices, such as the semiconductor device including the structure 100 of FIG. 1 or 2300 of FIG. 23, described above, or a combination thereof.

Accordingly, disclosed is a system comprising a three-dimensional array of memory devices comprising a stack of insulative tiers interleaved with word line tiers and comprising a channel pillar extending through the stack to a source region. The channel pillar has a sidewall defining a curved surface along at least a portion of the sidewall. At least one processor is coupled to the three-dimensional array of memory devices. At least one peripheral device is in operable communication with the at least one processor.

While the disclosure is susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A method of forming a semiconductor device, the method comprising:
   forming a stack of vertically-alternating tiers of insulative material and other material over a base material, a sacrificial material disposed in the base material, and a soft plug material disposed in the sacrificial material;
   forming an opening extending through the stack and through the soft plug material, leaving remnants of the soft plug material along sidewalls of the opening;
   forming a liner in the opening;
   exposing, through the liner, a portion of the sacrificial material;
   without removing the liner, removing the sacrificial material and the remnants of the soft plug material to define a gap between the liner and a sidewall of the base material, the gap exposing a portion of a lower tier of the stack;
   etching into the portion of the lower tier of the stack to define an undercut portion in the lower tier of the stack; and
   removing the liner to form a channel opening extending through the stack and into the base material, the channel opening exposing a source region of the base material at a base of the channel opening, the channel opening defined by sidewalls comprising the undercut portion.

2. The method of claim 1, wherein forming a liner in the opening comprises conformally forming polysilicon in the opening.

3. The method of claim 1, wherein etching into the portion of the lower tier of the stack to define an undercut portion in the lower tier of the stack comprises isotropically etching into the portion of the lower tier of the stack.

4. The method of claim 1, further comprising, after forming the liner in the opening and before exposing, through the liner, a portion of the sacrificial material:
   filling the opening with a fill material;
   removing an upper portion of the fill material to form a recess;
   forming another soft plug material in the recess;
   forming, over the other soft plug material and the stack of vertically-alternating tiers, another stack of the vertically-alternating tiers;
   forming another opening extending through the other stack and through the other soft plug material, leaving other remnants of the other soft plug material along sidewalls of the other opening;
   forming another liner in the other opening; and
   exposing, through the other liner, a portion of the fill material.

5. The method of claim 4, further comprising:
   without removing the liner or the other liner, removing the fill material and the remnants of the other soft plug material to define another gap between the other liner and the liner, the other gap exposing a portion of a lower tier of the other stack of the vertically-alternating tiers; and
   etching into the portion of the lower tier of the other stack to define another undercut portion in the lower tier of the other stack.

6. The method of claim 5, wherein etching into the portion of the lower tier of the stack and etching into the portion of the lower tier of the other stack are carried out simultaneously.

7. A method of forming a semiconductor device, the method comprising:
   forming a first deck of vertically-alternating tiers of insulative material and other material over a base material and a sacrificial material disposed in the base material;

forming an opening extending through the first deck and into the sacrificial material;
forming a liner and a fill material within the opening;
forming a second deck of vertically-alternating tiers of the insulative material and the other material over the first deck, the liner, and the fill material;
forming another opening extending through the second deck to the fill material within the opening;
forming another liner within the other opening;
exposing a portion of the fill material through the other liner;
without removing the liner or the other liner, removing the fill material and the sacrificial material to form an extended opening exposing at least a portion of a lower tier of each of the first deck and the second deck;
isotropically etching the portion of the lower tier of each of the first deck and the second deck to define undercut portions; and
removing the liner and the other liner to form a channel opening defined by sidewalls comprising the undercut portions.

8. The method of claim 7, wherein forming a first deck of vertically-alternating tiers of insulative material and other material over a base material and a sacrificial material disposed in the base material comprises forming a first deck of vertically-alternating tiers of oxide material and nitride material over the base material and a sacrificial material comprising tungsten.

9. The method of claim 7, wherein:
forming a liner and a fill material within the opening comprises forming a polysilicon liner and an oxide fill material within the opening; and
forming another liner within the other opening comprises forming another polysilicon liner within the other opening.

10. A method of forming an electronic device, comprising:
forming a deck above at least one sacrificial material, the deck comprising insulative structures vertically alternating with other structures and arranged in tiers;
forming an opening through the deck and to or into the at least one sacrificial material;
forming a liner in the opening along sidewalls of the deck;
without substantially removing sidewalls of the liner, removing at least a portion of the at least one sacrificial material to expose a portion of a lower surface of a lowest insulative structure of the insulative structures of the deck;
etching into the portion of the lower surface of the lowest insulative structure of the insulative structures of the deck; and
removing the liner to form a channel opening tapering through the tiers of the deck above the lowest insulative structure, the channel opening broadening at the lowest insulative structure.

11. The method of claim 10, further comprising, before forming the deck above the at least one sacrificial material, forming the at least one sacrificial material within a base material, the base material comprising a doped region below the at least one sacrificial material.

12. The method of claim 10, wherein forming the deck above the at least one sacrificial material comprises forming the deck above a sacrificial plug material recessed within an additional sacrificial material.

13. The method of claim 12, wherein forming the opening through the deck and to or into the at least one sacrificial material comprises forming the opening through the deck and through the sacrificial plug material to expose a portion of the additional sacrificial material.

14. The method of claim 13, wherein forming the liner in the opening along sidewalls of the deck further comprises forming the liner in the opening along sidewalls of remnants of the sacrificial plug material and along a surface of the additional sacrificial material.

15. The method of claim 10, further comprising, before forming the deck above the at least one sacrificial material:
forming a lower deck above a base material comprising a region of at least one additional sacrificial material, the lower deck comprising additional insulative structures vertically alternating with additional other structures and arranged in additional tiers;
forming an additional opening through the lower deck and to or into the at least one additional sacrificial material;
forming an additional liner in the additional opening along sidewalls of the lower deck; and
forming at least one sacrificial fill material on the additional liner within the additional opening,
wherein forming the deck above the at least one sacrificial material comprises forming the deck above the lower deck, the additional liner, and the at least one sacrificial fill material.

16. The method of claim 15, wherein forming the at least one sacrificial fill material on the additional liner within the additional opening comprises:
forming a first sacrificial fill material on the additional liner within the additional opening;
recessing the first sacrificial fill material; and
forming an additional sacrificial plug material on the first sacrificial fill material.

17. The method of claim 15, wherein forming the opening through the deck and to or into the at least one sacrificial material comprises forming the opening through the deck and to an elevation below an upper surface of the lower deck.

18. The method of claim 15, wherein forming the opening through the deck and to or into the at least one sacrificial material comprises forming the opening through the deck and to an elevation of an upper surface of the lower deck.

19. The method of claim 15, further comprising:
without substantially removing sidewalls of the additional liner, removing the at least one sacrificial fill material and removing at least a portion of the at least one additional sacrificial material to expose a portion of a lower surface of a lowest additional insulative structure of the additional insulative structures of the lower deck;
etching into the portion of the lower surface of the lowest additional insulative structure of the additional insulative structures of the lower deck; and
before, after, or while removing the liner, removing the additional liner to form the channel opening, the channel opening:
tapering through the tiers of the deck above the lowest insulative structure,
broadening at the lowest insulative structure of the deck,
tapering through the additional tiers of the lower deck above the additional lowest insulative structure, and
broadening at the additional lowest insulative structure of the lower deck.

20. The method of claim 10, further comprising forming a channel material in the channel opening, the channel material defining a shoulder at an elevation of the lowest insulative structure of the insulative structures of the deck.

\* \* \* \* \*